(12) United States Patent
Shen et al.

(10) Patent No.: US 10,559,684 B2
(45) Date of Patent: Feb. 11, 2020

(54) VERTICAL TRANSISTOR HAVING DUAL WORK FUNCTION MATERIALS AND METHOD FOR FABRICATING THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Zhaoxu Shen, Shanghai (CN); Duohui Bei, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 7 days.

(21) Appl. No.: 15/916,729

(22) Filed: Mar. 9, 2018

(65) Prior Publication Data
US 2018/0294351 A1 Oct. 11, 2018

(30) Foreign Application Priority Data
Apr. 7, 2017 (CN) .......................... 2017 1 0222212

(51) Int. Cl.
*H01L 29/78* (2006.01)
*H01L 29/66* (2006.01)
(Continued)

(52) U.S. Cl.
CPC .. *H01L 29/7827* (2013.01); *H01L 21/823462* (2013.01); *H01L 21/823842* (2013.01); *H01L 29/0649* (2013.01); *H01L 29/66666* (2013.01)

(58) Field of Classification Search
CPC ......... H01L 29/7827; H01L 21/823462; H01L 29/0649
See application file for complete search history.

(56) References Cited

U.S. PATENT DOCUMENTS

| | | | |
|---|---|---|---|
| 2006/0121678 A1* | 6/2006 | Brask | H01L 21/28079 438/287 |
| 2015/0380548 A1* | 12/2015 | Wang | H01L 29/7827 257/329 |

* cited by examiner

*Primary Examiner* — Errol V Fernandes
(74) *Attorney, Agent, or Firm* — Kilpatrick Townsend & Stockton LLP

(57) ABSTRACT

A semiconductor device includes a substrate, a semiconductor column vertically disposed on the substrate, a first contact material layer on the substrate and in contact with a lower portion of the semiconductor column, a first insulating material layer on the first contact material layer and having an upper surface lower than an upper surface of the semiconductor column, a gate dielectric material layer on the first insulating material layer and on a portion of sidewalls of the semiconductor column while exposing an upper portion of the semiconductor column, and a gate stack structure on the gate dielectric material layer and surrounding a portion of the gate dielectric material layer on the sidewalls of the semiconductor column. The gate stack structure includes from inside to outside a P-type work function layer, an N-type work function layer, and a gate.

18 Claims, 10 Drawing Sheets

(51) Int. Cl.
*H01L 21/8238* (2006.01)
*H01L 21/8234* (2006.01)
*H01L 29/06* (2006.01)

Provide a substrate structure including a substrate, a semiconductor column protruding vertically from the substrate, a first contact material layer on the substrate and in contact with a lower portion of the semiconductor column, a first insulating material layer on the first contact material layer, and a gate dielectric material layer on the first insulating material layer, on sidewalls and an upper surface of the semiconductor column ~102

Form a gate stack structure on the gate dielectric material layer, the gate stack structure surrounding a portion of the gate dielectric layer on the sidewalls of the semiconductor column and including, sequentially arranged from inside to outside, a P-type work function adjustment layer, an N-type work function adjustment layer, and a gate ~104

FIG. 1

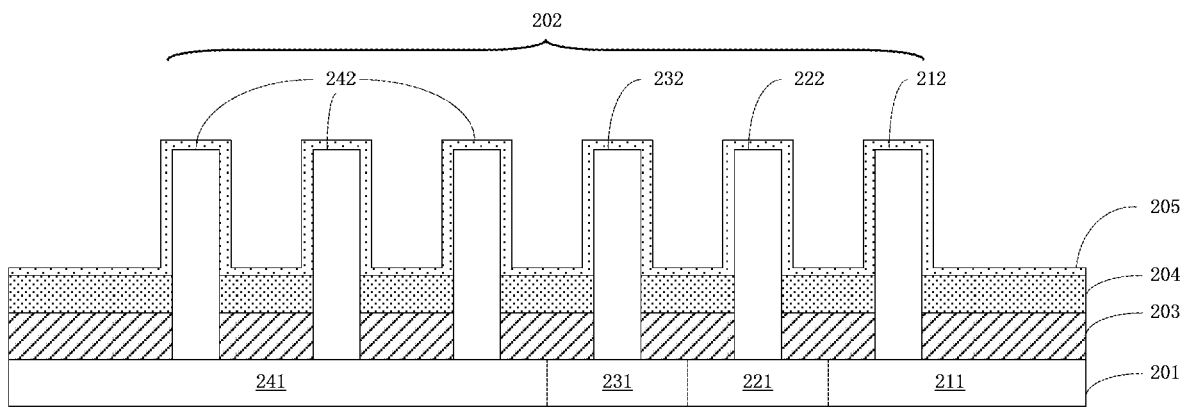

FIG. 2A

VERTICAL TRANSISTOR HAVING DUAL WORK FUNCTION MATERIALS AND METHOD FOR FABRICATING THEREOF

CROSS-REFERENCES TO RELATED APPLICATIONS

The present application claims priority to Chinese patent application No. 201710222212.8, filed with the State Intellectual Property Office of People's Republic of China on Apr. 7, 2017, the content of which is incorporated herein by reference in its entirety.

FIELD OF THE INVENTION

The present application relates to integrated semiconductor devices, and more particularly to a vertical transistor having dual work function materials and method for manufacturing the same.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have better control capability of gates than planar MOSFET devices to effectively suppress the short channel effect. Gate-all-around (GAA) devices have even better control ability than FinFET devices to more effectively suppress the short channel effect. An example of a GAA device is a nanowire vertical transistor.

In the manufacturing process of a FinFET or nanowire vertical transistor device, the device's threshold voltage (Vt) is generally adjusted by doping the fin or the nanowire. However, as the critical dimension of the device decreases, the size of the fin and the nanowire is getting smaller and smaller, adjusting the device's threshold voltage by doping is not ideal. For devices with different threshold voltages, there is a need for different doping levels of the fin or nanowire, but because the size of the fin and nanowire is getting smaller and smaller, the total amount of dopants that can be implanted in the fin or nanowire is limited. Therefore, the range of the threshold voltages through doping the fin or the nanowire is also limited. In addition, adjusting the threshold voltages by doping will inevitably cause damage to the fin or the nanowire. Further, implantation of dopants into the fin or the nanowire may result in mobility degradation in the channel due to dopant scattering.

BRIEF SUMMARY OF THE INVENTION

The present disclosure provides a novel technique and structure for adjusting voltage thresholds of a semiconductor device without having the above-described problems.

In one aspect of the present disclosure, a semiconductor device includes a substrate, a semiconductor column vertically disposed on the substrate, a first contact material layer on the substrate and in contact with a lower portion of the semiconductor column, a first insulating material layer on the first contact material layer and having an upper surface lower than an upper surface of the semiconductor column, a gate dielectric material layer on the first insulating material layer and on a portion of sidewalls of the semiconductor column while exposing an upper portion of the semiconductor column, and a gate stack structure on the gate dielectric material layer and surrounding a portion of the gate dielectric material layer on the sidewalls of the semiconductor column. The gate stack structure includes, sequentially from inside to outside, a P-type work function layer, an N-type work function layer, and a gate.

In one embodiment, the substrate includes a first PMOS device region having a first PMOS device, a second PMOS device region having a second PMOS device, a first NMOS device region having a first NMOS device, and a second NMOS device region having a second NMOS device. The semiconductor column includes a first semiconductor pillar on the first PMOS device region, a second semiconductor pillar on the second PMOS device region, a third semiconductor pillar on the first NMOS device region, and a fourth semiconductor pillar on the second PMOS device region. The P-type work function layer of the gate stack structure includes a first P-type work function layer surrounding the first semiconductor pillar, a second P-type work function layer surrounding the second semiconductor pillar, a third P-type work function layer surrounding the third semiconductor pillar, and a fourth P-type work function layer surrounding the fourth semiconductor pillar. The first PMOS device has a threshold voltage greater than a threshold voltage of the second PMOS device. The first NMOS device has a threshold voltage greater than a threshold voltage of the second NMOS device. The first, second, third, and fourth P-type work function layers are different from each other.

In one embodiment, the first P-type work function layer includes, sequentially from inside to outside, a second TiN layer, a third TiN layer, and a fourth TiN layer. The second P-type work function layer includes, sequentially from inside to outside, a first TiN layer, the second TiN layer, the third TiN layer, and the fourth TiN layer. The third P-type work function layer includes, sequentially from inside to outside, the third TiN layer, and the fourth TiN layer. The fourth P-type work function layer includes the third TiN layer.

In another embodiment, the first P-type work function layer includes, sequentially from inside to outside, a first TiN layer, a TaN layer, a third TiN layer, and a fourth TiN layer. The second P-type work function layer includes, sequentially from inside to outside, the first TiN layer, the TaN layer, a second TiN layer, the third TiN layer, and the fourth TiN layer. The third P-type work function layer includes, sequentially from inside to outside, the first TiN layer, the TaN layer, and the fourth TiN layer. The fourth P-type work function layer includes the first TiN layer and the TaN layer.

In yet another embodiment, the first P-type work function layer includes, sequentially from inside to outside, a first TiN layer, a TaN layer, a third TiN layer, a fourth TiN layer, and a fifth TiN layer. The second P-type work function layer includes, sequentially from inside to outside, the first TiN layer, the TaN layer, the third TiN layer, and the fourth TiN layer. The third P-type work function layer includes, sequentially from inside to outside, the fourth TiN layer and the fifth TiN layer. The fourth P-type work function layer includes the fifth TiN layer.

In still another embodiment, the first P-type work function layer includes, sequentially from inside to outside, a first TiN layer, a TaN layer, and a third TiN layer. The second P-type work function layer includes, sequentially from inside to outside, the first TiN layer, the TaN layer, a second TiN layer, and the third TiN layer. The third P-type work function layer includes, sequentially from inside to outside, the first TiN layer and the TaN layer. The fourth P-type work function layer includes the third TiN layer.

In still another embodiment, the first P-type work function layer includes, sequentially from inside to outside, a first TiN layer, a TaN layer, and a third TiN layer. The second P-type work function layer includes, sequentially from inside to outside, the first TiN layer, the TaN layer, a second TiN layer, and the third TiN layer. The third P-type work function layer includes, sequentially from inside to outside, the first TiN layer and the TaN layer. The fourth P-type work function layer includes the TaN layer.

In one embodiment, the semiconductor device further includes a second insulating layer on the gate stack structure having an upper surface flush with an upper surface of the gate dielectric material layer, and a second contact material layer in contact with the upper portion of the semiconductor column.

In one embodiment, the semiconductor device further includes a first contact extending to the first contact material layer, a second contact extending to the gate, and a third contact in contact with the second contact material layer.

In one embodiment, the semiconductor column is a nanowire.

In another aspect of the present disclosure, a method for manufacturing a semiconductor device may include providing a substrate structure including a substrate, a semiconductor column vertically disposed on the substrate, a first contact material layer on the substrate and in contact with a lower portion of the semiconductor column, a first insulating material layer on the first contact material layer and having an upper surface lower than an upper surface of the semiconductor column, and a gate dielectric material layer on the first insulating material layer and on sidewalls and an upper surface of the semiconductor column, and forming a gate stack structure on the gate dielectric material layer surrounding a portion of the gate dielectric material layer on the sidewalls of the semiconductor column. The gate stack structure includes, sequentially from inside to outside, a P-type work function layer, an N-type work function layer, and a gate.

In one embodiment, the substrate includes a first PMOS device region having a first PMOS device, a second PMOS device region having a second PMOS device, a first NMOS device region having a first NMOS device, and a second NMOS device region having a second NMOS device. The semiconductor column includes a first semiconductor pillar on the first PMOS device region, a second semiconductor pillar on the second PMOS device region, a third semiconductor pillar on the first NMOS device region, and a fourth semiconductor pillar on the second PMOS device region. The P-type work function layer of the gate stack structure includes a first P-type work function layer surrounding the first semiconductor pillar, a second P-type work function layer surrounding the second semiconductor pillar, a third P-type work function layer surrounding the third semiconductor pillar, and a fourth P-type work function layer surrounding the fourth semiconductor pillar. The first PMOS device has a threshold voltage greater than a threshold voltage of the second PMOS device. The first NMOS device has a threshold voltage greater than a threshold voltage of the second NMOS device. The first, second, third, and fourth P-type work function layers are different from each other.

In one embodiment, forming the gate stack structure includes forming a P-type work function adjustment material layer on a portion of the gate dielectric material layer disposed on sidewalls of a corresponding semiconductor pillar on one of the device regions; forming an N-type work function adjustment material layer on the P-type work function adjustment material layer; forming a gate material layer on the gate dielectric layer and on the N-type work function adjustment layer; planarizing the gate material layer such that an upper surface of the gate material layer is flush with an upper surface of the gate dielectric material layer on the semiconductor column; etching the gate material layer, the P-type work function adjustment material layer, and the N-type work function adjustment material layer to expose a portion of the gate dielectric material layer on the upper surface and the sidewalls of the semiconductor column.

In one embodiment, forming the P-type work function adjustment material layer on the portion of the gate dielectric material layer disposed on sidewalls of the corresponding semiconductor pillar on one of the device regions includes forming an initial P-type work function adjustment material layer corresponding to one of the devices on the substrate structure, and etching the initial P-type work function adjustment material layer using an anisotropic etching process to form a corresponding P-type work function adjustment material layer.

In one embodiment, forming the initial P-type work function adjustment material layer includes depositing a first TiN layer on the substrate structure; removing a portion of the first TiN layer on the first PMOS device region; depositing a second TiN layer; removing a portion of the second TiN layer and a portion of the first TiN layer on the first NMOS device region; depositing a third TiN layer; removing a portion of the third TiN layer, a portion of the second TiN layer, and a portion of the first TiN layer on the second NMOS device region; and depositing a fourth TiN layer.

In one embodiment, forming the initial P-type work function adjustment material layer includes sequentially depositing a first TiN layer, a TaN layer, and a second TiN layer on the substrate structure; removing a portion of the second TiN layer on the first PMOS device region; depositing a third TiN layer; removing a portion of the second TiN layer and a portion of the third TiN layer on the first NMOS device region; depositing a fourth TiN layer; removing a portion of the second TiN layer, a portion of the third TiN layer, and a portion of the fourth TiN layer on the second NMOS device region.

In one embodiment, forming the initial P-type work function adjustment material layer includes sequentially depositing a first TiN layer, a TaN layer, and a second TiN layer on the substrate structure; removing a portion of the second TiN layer on the first PMOS device region; depositing a third TiN layer; removing a portion of the first TiN layer, a portion of the TaN layer, a portion of the second TiN layer, and a portion of the third TiN layer on the first NMOS device region; depositing a fourth TiN layer; removing a portion of the first TiN layer, a portion of the TaN layer, a portion of the second TiN layer, a portion of the third TiN layer, and a portion of the fourth TiN layer on the second NMOS device region; and depositing a fifth TiN layer.

In one embodiment, forming the initial P-type work function adjustment material layer includes sequentially depositing a first TiN layer, a TaN layer, and a second TiN layer on the substrate structure; removing a portion of the second TiN layer on the first PMOS device region; depositing a third TiN layer; removing a portion of the second TiN layer and a portion of the third TiN layer on the first NMOS device region; and removing a portion of the TaN layer, a portion of the second TiN layer, and a portion of the third TiN layer on the second NMOS device region.

In one embodiment, forming the initial P-type work function adjustment material layer includes sequentially depositing a first TiN layer, a TaN layer, and a second TiN layer on the substrate structure; removing a portion of the second TiN layer on the first PMOS device region; removing a portion of the first TiN layer, a portion of TaN layer, and a portion of the second TiN layer on the second NMOS device region; depositing a third TiN layer; and removing a portion of the second TiN layer and a portion of the third TiN layer on the first NMOS device region.

In one embodiment, forming the initial P-type work function adjustment material layer includes depositing a first TiN layer on the substrate structure; removing a portion of the first TiN layer on the second NMOS device region; sequentially depositing a TaN layer and a second TiN layer; removing a portion of the second TiN layer on the first PMOS device region; depositing a third TiN layer; and removing a portion of the second TiN layer and a portion of the third TiN layer on the first and second NMOS device regions.

In one embodiment, the method further includes forming a second insulating material layer on the gate stack structure having an upper surface lower than the upper surface of the semiconductor column; removing a portion of the gate dielectric material layer above the upper surface of the second insulating material layer to expose an upper portion of the semiconductor column; and forming a second contact material layer on the upper portion of the semiconductor column.

In one embodiment, the method further includes forming a first contact extending to the first contact material layer; forming a second contact extending to the gate; and forming a third contact in contact with the second contact material layer The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

FIG. 1 is a simplified flowchart of a method for manufacturing a semiconductor device according to some embodiments of the present disclosure.

FIGS. 2A to 2F are cross-sectional views of intermediate stages of a manufacturing method of a semiconductor device according to an embodiment of the present disclosure.

DETAILED DESCRIPTION OF THE INVENTION

Figure 2B:
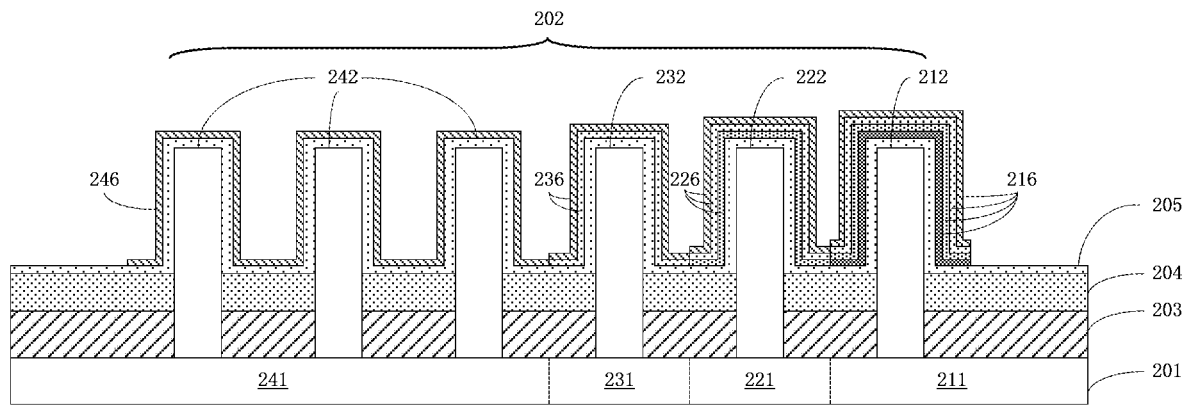

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present invention now will be described more fully hereinafter with reference to the accompanying drawings, in which embodiments of the invention are shown. This invention may, however, be embodied in many different forms and should not be construed as limited to the embodiments set forth herein.

FIG. 1 is a simplified flowchart of a method for manufacturing a semiconductor device according to some embodiments of the present invention. Referring to FIG. 1, the method include:

Step 102: providing a substrate structure including a substrate, a semiconductor column disposed substantially vertically in relation to the surface of the substrate, a first contact material layer on the substrate and in contact with a lower portion of the semiconductor column, a first insulating material layer on the first contact material layer and having an upper surface lower than an upper surface of the semiconductor column, and a gate dielectric layer on the first insulating material layer, and on the upper surface and sidewalls of the semiconductor column.

Step 104: forming a gate stack structure on the gate dielectric material layer. The gate stack structure surrounds a portion of the gate dielectric material layer disposed on the sidewalls of the semiconductor column. The gate stack structure includes, sequentially arranged from inside to outside, a P-type work function adjustment layer, an N-type work function adjustment layer, and a gate.

The method according to the embodiment of the present disclosure introduces a P-type work function adjustment layer and an N-type work function adjustment layer for adjusting the threshold voltage of the vertical nanowire transistor device. The method is suitable for adjusting threshold voltages of vertical nanowire transistors. This method of adjusting threshold voltages is not limited by the total amount of dopants. The range of threshold voltages can be adjusted by adjusting the material and thickness of the P-type work function adjustment layer and the material and thickness of the N-type work function adjustment layer for use in different types of devices. Further, the threshold voltage adjustment does not cause damage to the semiconductor column and avoid carrier mobility degradation in the channel due to dopant scattering.

In practical applications, different types of devices have different threshold voltages, and different P-type work function adjustment layer can be used for different types of devices.

In one embodiment, the substrate of the substrate structure may include a first PMOS device region having a first PMOS device, a second PMOS device region having a second PMOS device, a first NMOS device region having a first NMOS device, and a second NMOS device region having a second NMOS device. The threshold voltage of the first PMOS device is greater than the threshold voltage of the second PMOS device, and the threshold voltage of the first NMOS device is greater than the threshold voltage of the second NMOS device. For example, the first PMOS device is a P-type standard threshold voltage transistor (PSVT), the second PMOS device is a P-type low threshold voltage transistor (PLVT) or a P-type ultra-low threshold voltage transistor (PULVT). The first NMOS device is an N-type standard threshold voltage transistor (NSVT), the second NMOS device is an N-type low threshold voltage transistor (NLVT) or an N-type ultra-low threshold voltage transistor (NULVT). A PULVT can be changed to a PLVT, or an NULVT can be changed to an NLVT by varying a concentration of an implanted dopant in the semiconductor column.

In the embodiment, the semiconductor column may include a first semiconductor pillar on the first PMOS device region, a second semiconductor pillar on the second PMOS device region, a third semiconductor pillar on the first NMOS device region, and a fourth semiconductor pillar on the second NMOS device region. The P-type work function adjustment layers in the gate stack structures surrounding the first semiconductor pillar, the second semiconductor pillar, the third semiconductor pillar, and the fourth semiconductor pillar are a first P-type work function adjustment layer, a second work function adjustment layer, a third work function adjustment layer, and a fourth work function adjustment layer, respectively. The first P-type work function adjustment layer, the second work function adjustment layer, the third work function adjustment layer, and the fourth work function adjustment layer are different from each other.

A method for manufacturing a semiconductor device according to an embodiment of the present disclosure will be described in detail with reference to FIGS. 2A to 2F.

Referring to FIG. 2A, a substrate structure is provided. The substrate structure includes a substrate 201. In one embodiment, substrate 201 includes a first PMOS device region 211 having a first PMOS device, a second PMOS device region 221 having a second PMOS device, a first NMOS device region 231 having a first NMOS device, and a second NMOS device region 241 having a second NMOS device. In one embodiment, the first PMOS device is a PSVT, the second PMOS device is a PLVT or a PULVT, the first NMOS device is an NSVT, and the second NMOS device is an NLVT or an NULVT.

The substrate structure also includes a semiconductor column 202 protruding substantially vertically from substrate 201. In one embodiment, semiconductor column 202 includes a first semiconductor pillar 212 on first PMOS device region 211, a second semiconductor pillar 222 on second PMOS device region 221, a third semiconductor pillar 232 on first NMOS device region 231, and a fourth semiconductor pillar 242 on second NMOS device region 241. In one embodiment, semiconductor column 202 is a nanowire. As used herein, the term "vertical semiconductor column" or "vertically protruding semiconductor column" refers to the longitudinal orientation of the semiconductor column in the vertical direction in relation to the flat surface of the substrate. As used herein, the term "substantially vertical" refers to a vertical orientation within the process variations. As used herein, the term "nanowire" refers to a semiconductor wire having an undoped material or a controlled doping and composite in the longitudinal or radial directions, or in both longitudinal and redial directions. The nanowire may include different materials when viewed longitudinally. The nanowire may have various cross-sectional shapes in a transverse direction perpendicular to the longitudinal direction. The various cross-sectional shapes may be circular, oval, square, rectangular, and hexagonal.

The substrate structure further includes a first contact material layer 203 on the surface of substrate 201 and in contact with a lower portion of semiconductor column 202. In one embodiment, first contact material layer 203 may include tungsten, nickel, cobalt, titanium, or platinum.

The substrate structure further includes a first insulating material layer (e.g., silicon oxide) 204 on first contact material layer 203. First insulating material layer 204 has an upper surface that is lower than an upper surface of semiconductor column 202.

The substrate structure further includes a gate dielectric material layer (e.g., a high-k dielectric layer) 205 on first insulating material layer 204 and on the upper surface and sidewalls of semiconductor column 202.

Next, the method includes forming a P-type work function adjustment material layer corresponding to the device type on gate dielectric material layer 205 on sidewalls of each of semiconductor pillars 212, 222, 232, and 242.

Figure 2C:
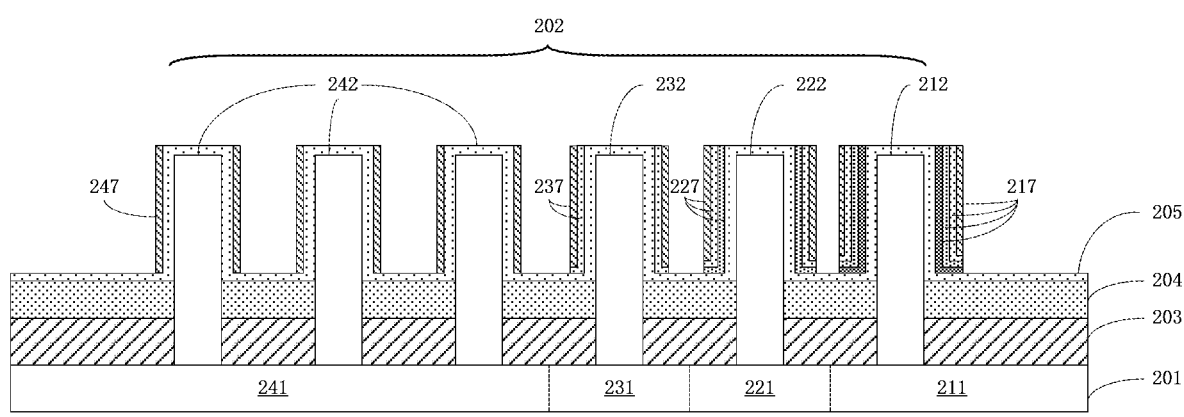

In one embodiment, the P-type work function adjustment material layer corresponding to the device type may be formed in the manner shown in FIGS. 2B and 2C.

Referring to FIG. 2B, an initial P-type work function adjustment material layer corresponding to the device type is formed on the substrate structure. For example, a first initial P-type work function adjustment material layer 216 corresponding to the first PMOS device type is formed on gate dielectric material layer 205 on first PMOS device region 211, a second initial P-type work function adjustment material layer 226 corresponding to the second PMOS device type is formed on gate dielectric material layer 205 on second PMOS device region 221, a third initial P-type work function adjustment material layer 236 corresponding to the first NMOS device type is formed on gate dielectric material layer 205 on first NMOS device region 231, and a fourth initial P-type work function adjustment material layer 246 corresponding to the second NMOS device type is formed on gate dielectric material layer 205 on second NMOS device region 241.

Several implementations of an initial P-type function adjustment material layer corresponding to a device type on the substrate for the substrate structure including the different device regions are available. These implementations of the different initial P-type function adjustment material layers will be described in detail later below.

Referring to FIG. 2C, each of initial P-type work function adjustment material layers 216, 226, 236, 246 is etched by an anisotropic etching process to form a corresponding P-type work function adjustment layer 217, 227, 237, 247, respectively. The anisotropic etching process removes the horizontal portions of each of the initial P-type work function adjustment material layers while retaining the vertical portions of each of the initial P-type work function adjustment material layers on the sidewalls of each of the semiconductor pillars.

Figure 2D:
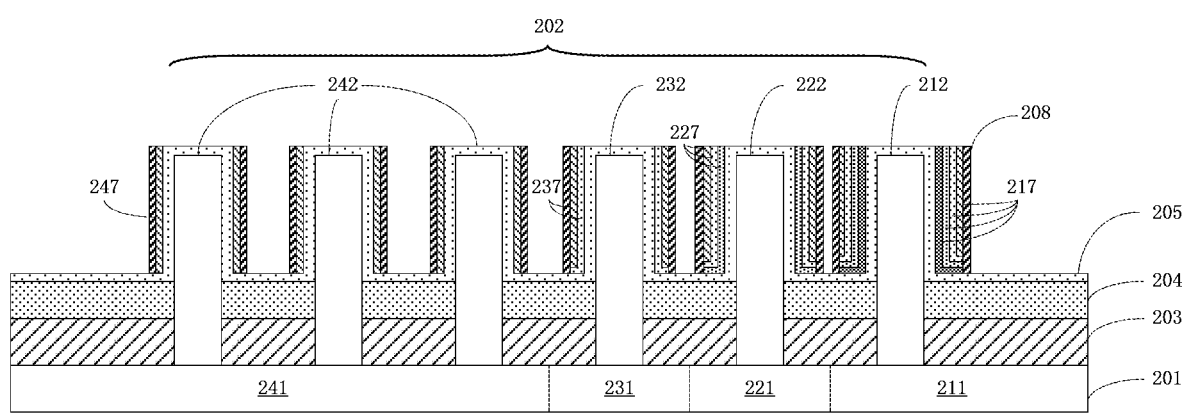

Next, referring to FIG. 2D, an N-type work function adjustment layer 208 is formed on each of the P-type work function adjustment layer. In one embodiment, N-type work function adjustment layer 208 may include TiAl, TiCAl, TiBAl, or TiSiAl.

Figure 2E:
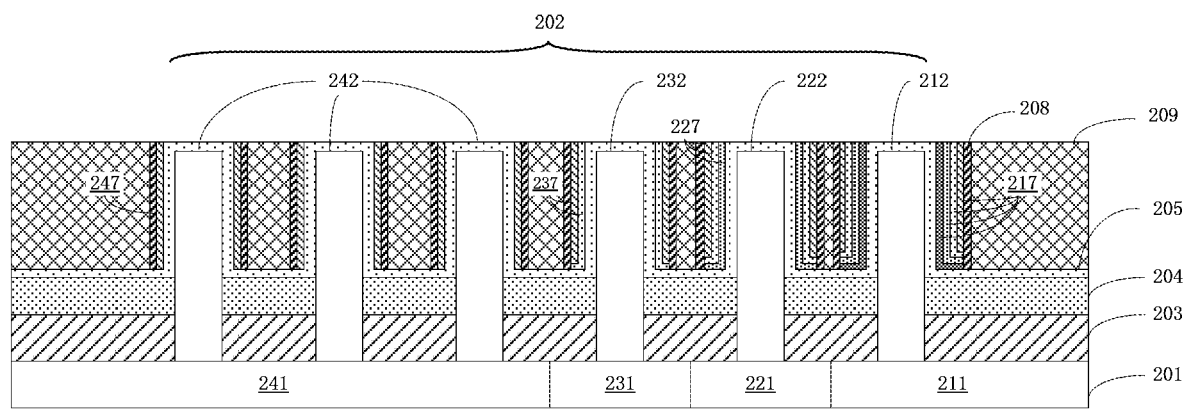

Thereafter, referring to FIG. 2E, a gate material layer (e.g., tungsten) 209 is deposited on the substrate structure having N-type work function adjustment layer 208 formed on the P-type work function adjustment layer of FIG. 2D. Thereafter, gate material layer 209 is submitted to a planarization process so that an upper surface of remaining gate material layer 209 is substantially flush with the upper surface of gate dielectric material layer 205. In some embodiments, the method also includes forming a barrier layer (e.g., TiN) between N-type work function adjustment layer 208 and gate material layer 209.

Figure 2F:
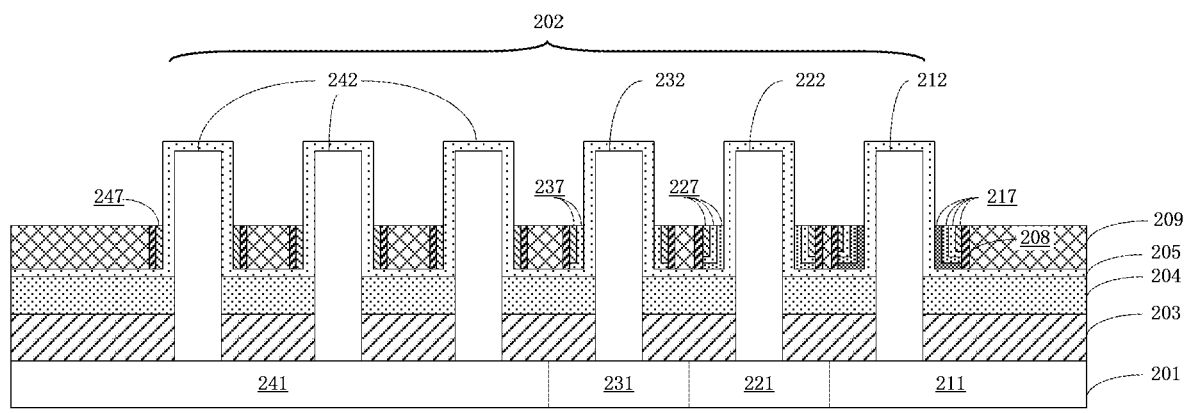

Thereafter, referring to FIG. 2F, remaining gate material layer (i.e., a gate) 209, P-type work function adjustment layers 217, 227, 237, 247, and N-type work function adjustment material layer 208 are etched back to expose a portion of gate dielectric material layer 205 on the upper surface of semiconductor column 202 and a portion of gate dielectric material layer 205 on sidewalls of semiconductor column 202 to form a corresponding gate stack structure.

Each gate stack structure surrounds a portion of a gate dielectric material layer on sidewalls of a corresponding semiconductor pillar. The gate stack structure includes, sequentially arranged from inside to outside, a P-type work function adjustment layer, an N-type work function adjustment layer, and a gate. For example, the gate stack structure on first PMOS device region 211 surrounding a portion of gate dielectric material layer 205 on sidewalls of first semiconductor pillar 212 includes, sequentially arranged from inside to outside, first P-type work function adjustment layer 217, N-type work function adjustment layer 208, and gate 209. The gate stack structure on second PMOS device region 221 surrounding a portion of gate dielectric material layer 205 on sidewalls of second semiconductor pillar 222 includes, sequentially arranged from inside to outside, second P-type work function adjustment layer 227, N-type work function adjustment layer 208, and gate 209. The gate stack structure on first NMOS device region 231 surrounding a portion of gate dielectric material layer 205 on sidewalls of third semiconductor pillar 232 includes, sequentially arranged from inside to outside, third P-type work function adjustment layer 237, N-type work function adjustment layer 208, and gate 209. The gate stack structure on second NMOS device region 241 surrounding a portion of gate dielectric material layer 205 on sidewalls of fourth semiconductor pillar 242 includes, sequentially arranged from inside to outside, fourth P-type work function adjustment layer 247, N-type work function adjustment layer 208, and gate 209.

Thereafter, subsequent processes may be performed according to actual requirements.

A method for manufacturing a semiconductor device according to another embodiment of the present disclosure will be described in detail with reference to FIGS. 3A to 3C. In the method, the following steps may be performed after forming the substrate structure shown in FIG. 2F.

Figure 3A:
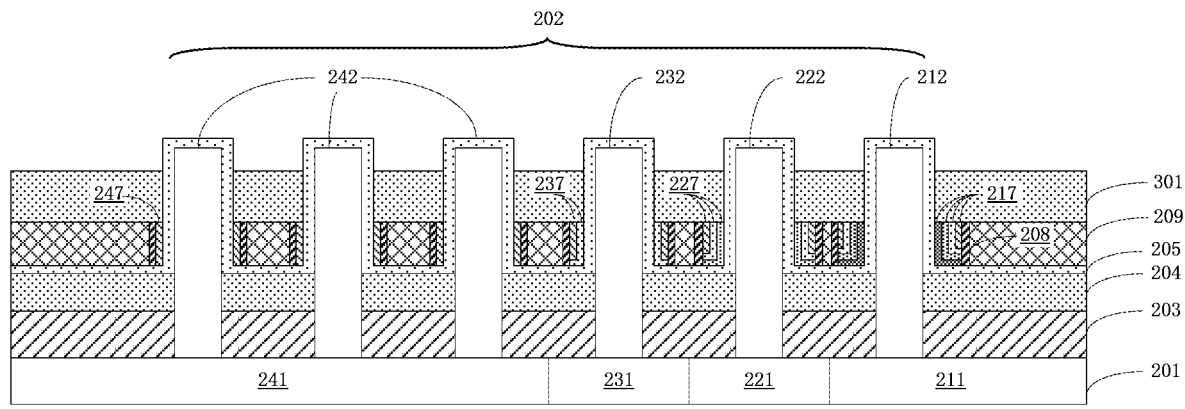
FIGS. 3A to 3C are cross-sectional views of intermediate stages of a manufacturing method of a semiconductor device according to an embodiment of the present disclosure.

Referring to FIG. 3A, a second insulating material layer (e.g., silicon oxide) 301 is formed on the gate stack structure. Second insulating material layer 301 has an upper surface that is lower than the upper surface of semiconductor column 202.

Figure 3B:
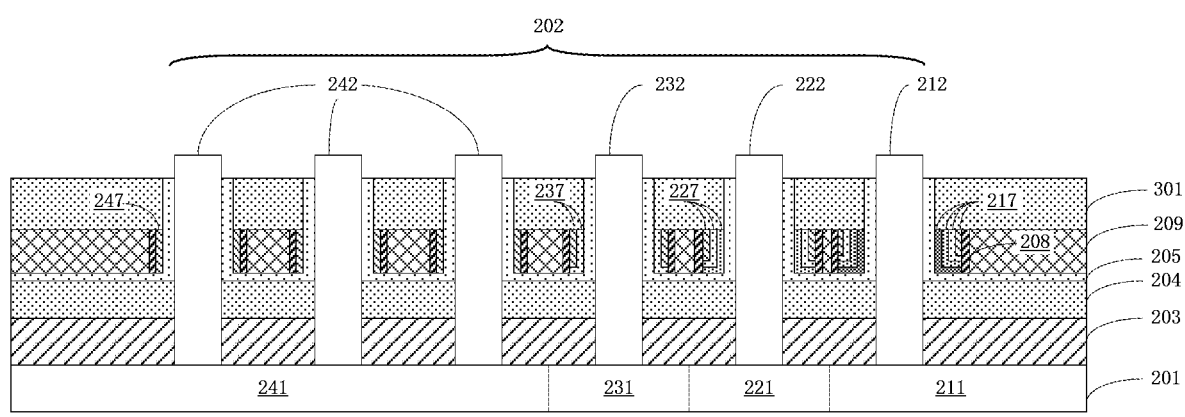

Next, referring to FIG. 3B, a portion of gate dielectric material layer 205 on semiconductor column 202 above the upper surface of second insulating material layer 301 is removed.

Figure 3C:
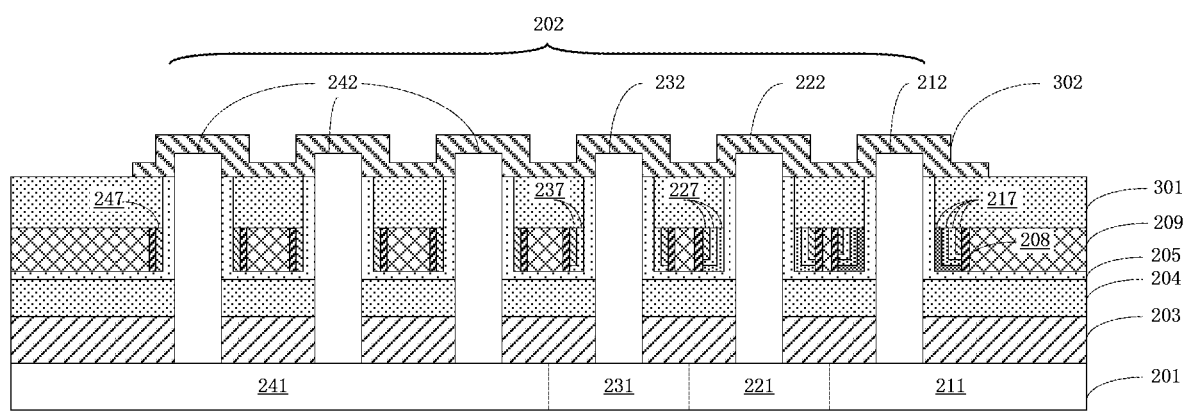

Thereafter, referring to FIG. 3C, a second contact material layer 302 is formed on the upper portion of semiconductor column 202. Second contact material layer 302 may include tungsten, nickel, cobalt, titanium, or platinum.

Thereafter, the method may further include forming a first contact (not shown) extending to first contact material layer 203, a second contact (not shown) extending to gate 209, and a third contact (not shown) in contact with second contact material layer 302. Forming contact plugs to regions in a semiconductor device are well known to those skilled in the art and will not be described herein for the sake of brevity.

Different embodiments for forming an initial P-type work function adjustment layer corresponding to a device type on the surface of the substrate structure will be described in detail below.

It is to be noted that, in order to more clearly illustrate the initial P-type work function adjustment layer on the different device regions, the semiconductor column will not be shown in the following drawings, only the P-type work function adjustment material layers on the different device regions will be shown in a planar manner.

FIGS. 4A to 4D are cross-sectional views of intermediate stages of a method for forming an initial P-type work function adjustment material layer according to a first embodiment of the present disclosure.

Figure 4A:
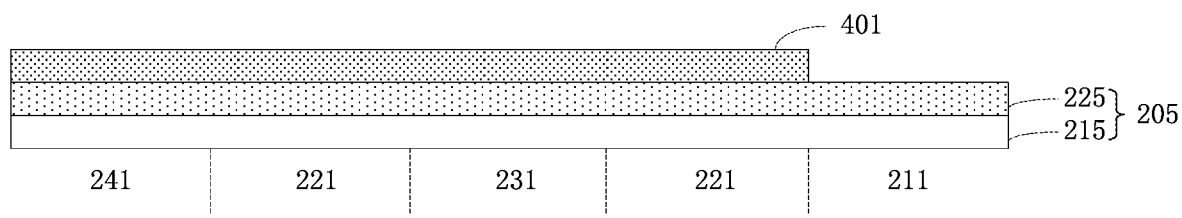
FIGS. 4A to 4D are cross-sectional views of intermediate stages of a method for forming an initial P-type work function adjustment material layer according to a first embodiment of the present disclosure.

Referring to FIG. 4A, a first TiN layer 401 is deposited on the substrate structure shown in FIG. 2A, i.e., first TiN layer 401 is deposited on gate dielectric layer 205. Next, a portion of first TiN layer 401 on first PMOS device region is removed. Herein, it is to be understood that, although gate dielectric layer 205 is shown to include an interface layer 215 and a high-k dielectric layer 225 on interface layer 215, this is not intended to limit the scope of the present disclosure. For example, a patterned photoresist may be formed on first TiN layer 401, or a bottom anti-reflective coating (BARC) and a photoresist may be formed to expose a portion of first TiN 401 on first PMOS device region 211. The portion of first TiN layer 401 on first PMOS device region 211 is then removed by etching using the patterned photoresist as a mask. Thereafter, the photoresist or the BARC and the photoresist may be removed by dry etching, wet etching, or sputtering by reactive ion etching.

Figure 4B:
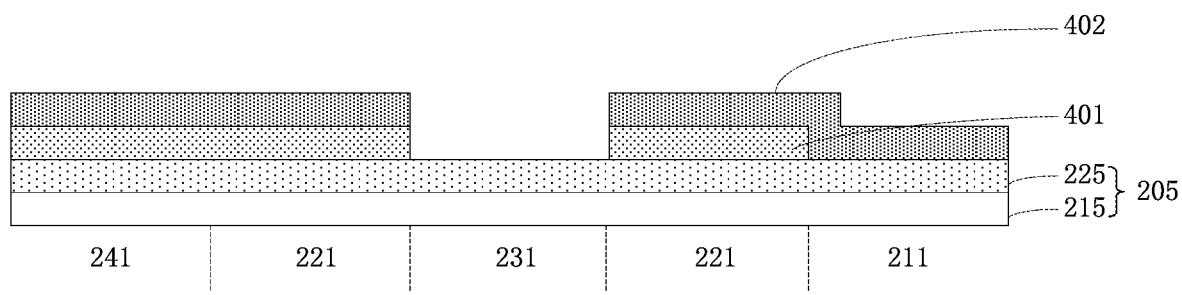

Referring to FIG. 4B, a second TiN layer 402 is deposited on first TiN layer 401 and the exposed first PMOS device region 211. Thereafter, a portion of first TiN layer and a portion of second TiN layer 402 on first NMOS device region 231 are removed. In one example embodiment, the portion of first TiN layer 401 and the portion of second TiN layer 402 on first NMOS device region 231 may be removed by dry etching, wet etching, or sputtering such as reactive ion etching.

Figure 4C:
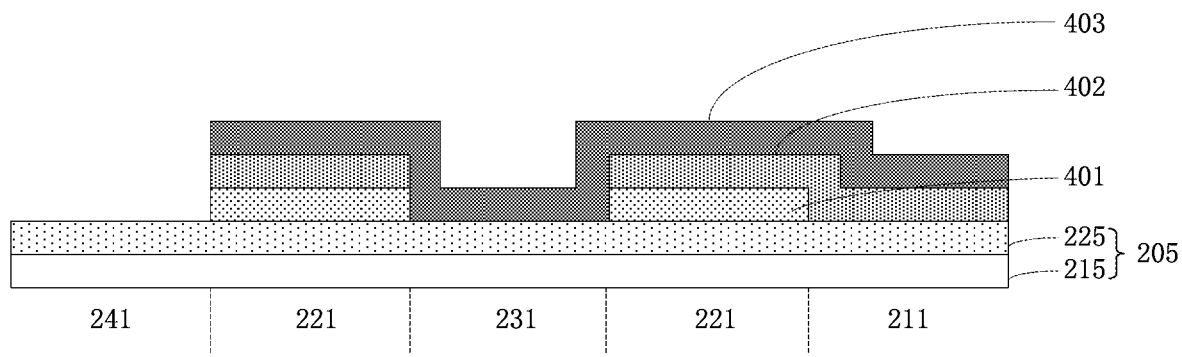

Referring to FIG. 4C, a third TiN layer 403 is deposited on second TiN layer 402 and the exposed first NMOS device region 231. Thereafter, a portion of first TiN layer, a portion of second TiN layer 402, and a portion of third TiN layer 403 on second NMOS device region 241 are removed. In one example embodiment, the portion of first TiN layer 401, the portion of second TiN layer 402, and the portion of third TiN layer 403 on second NMOS device region 241 may be removed by dry etching, wet etching, or sputtering such as reactive ion etching.

Figure 4D:
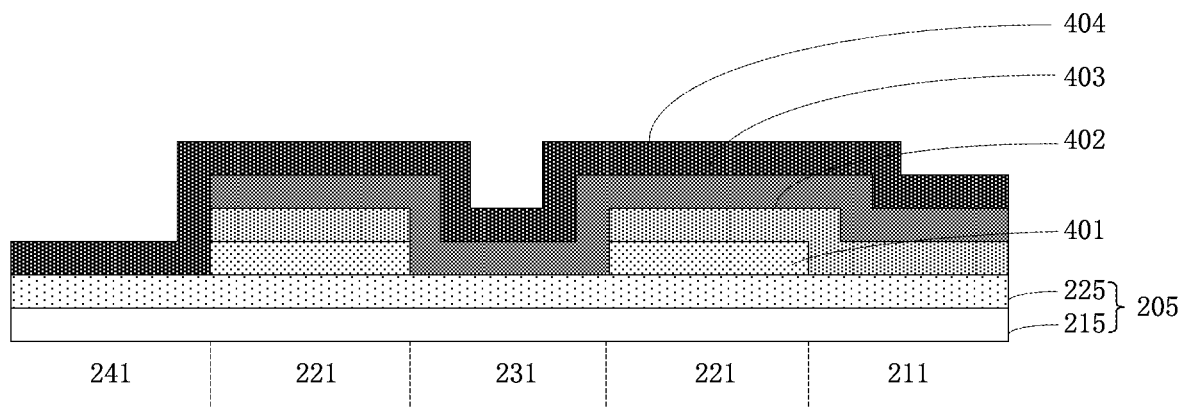

Referring to FIG. 4D, a fourth TiN layer 404 is deposited on third TiN layer 403 and on exposed second NMOS device region 241.

In this manner, different initial P-type work function adjustment material layers are formed over the different device regions. The corresponding P-type work function adjustment layers are then formed with reference to FIGS. 2A to 2F.

Figure 5A:
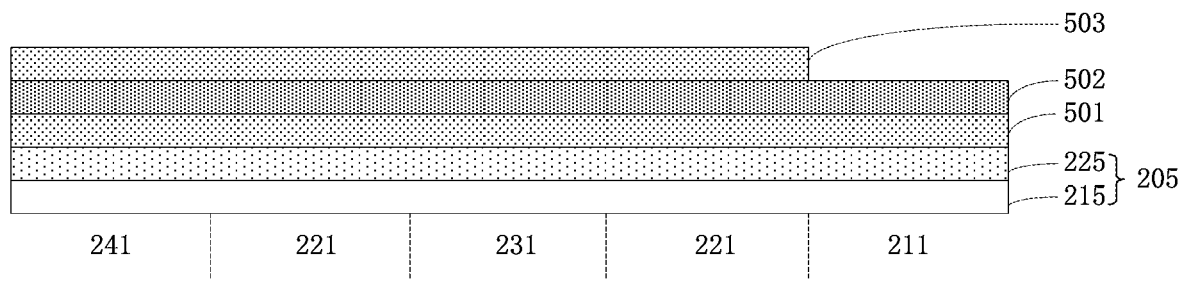
FIGS. 5A to 5C are cross-sectional views of intermediate stages of a method for forming an initial P-type work function adjustment material layer according to a second embodiment of the present disclosure.
Figure 5B:
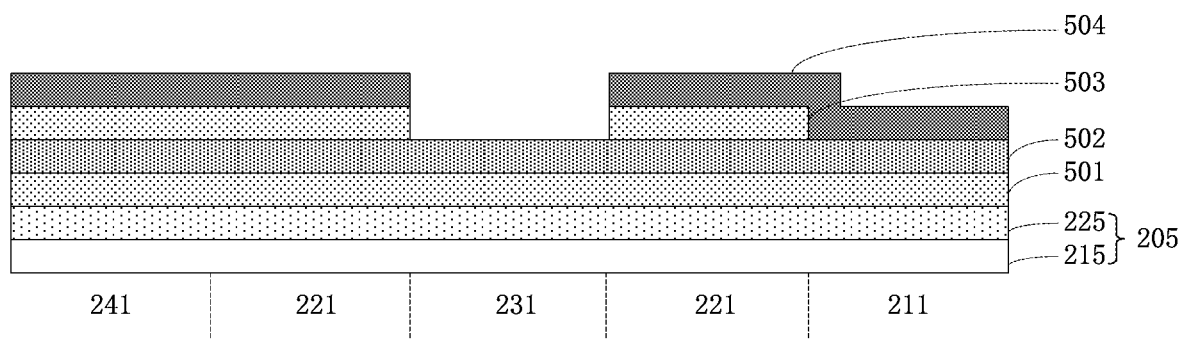
Figure 5C:
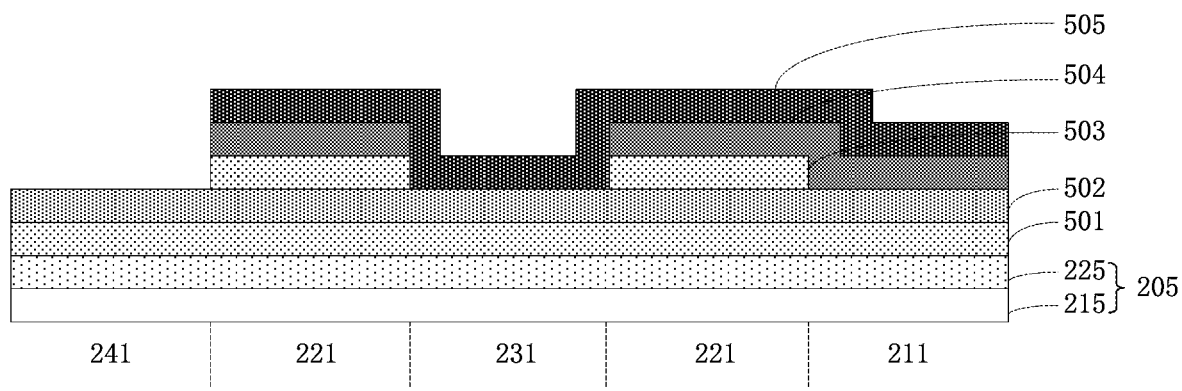

FIGS. 5A to 5C are cross-sectional views of intermediate stages of a method for forming an initial P-type work function adjustment material layer according to a second embodiment of the present disclosure.

Referring to FIG. 5A, a first TiN layer 501, a TaN layer 502, and a second TiN layer 503 are sequentially deposited on the substrate structure shown in FIG. 2A (i.e., on gate dielectric layer 205). Then, a portion of second TiN layer 503 on first PMOS device region 211 is removed.

Referring to FIG. 5B, a third TiN layer 504 is deposited on second TiN layer 503 and exposed portion of TaN layer 502. Thereafter, a portion of third TiN layer 504 and a portion of second TiN layer 503 on first NMOS device region 231 are removed.

Referring to FIG. 5C, a fourth TiN layer 505 is deposited on third TiN layer 504 and exposed portion of TaN layer 502. Thereafter, a portion of fourth TiN layer 505, a portion of third TiN layer 504, and a portion of second TiN layer on second NMOS device region 241 are removed.

In this manner, different initial P-type work function adjustment material layers are formed over the different device regions. The corresponding P-type work function adjustment layers are then formed with reference to FIGS. 2A to 2F.

FIGS. 6A to 6D are cross-sectional views of intermediate stages of a method for forming an initial P-type work function adjustment material layer according to a third embodiment of the present disclosure.

Figure 6A:
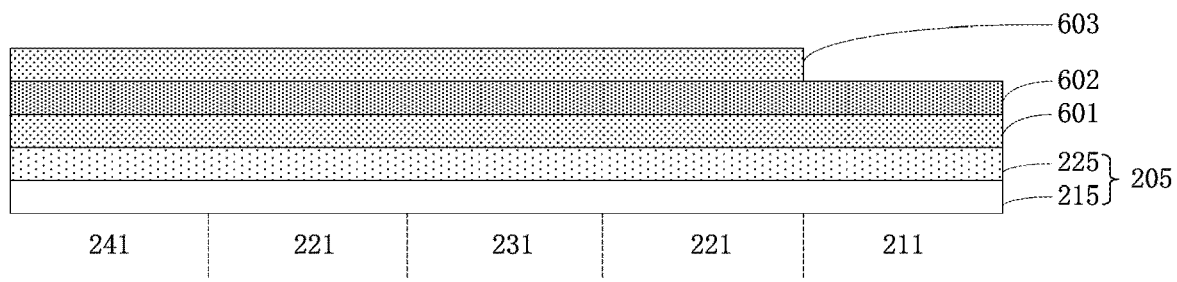
FIGS. 6A to 6D are cross-sectional views of intermediate stages of a method for forming an initial P-type work function adjustment material layer according to a third embodiment of the present disclosure.

Referring to FIG. 6A, a first TiN layer 601, a TaN layer 602, and a second TiN layer 603 are sequentially deposited on the substrate structure shown in FIG. 2A (i.e., on gate dielectric layer 205). Thereafter, a portion of second TiN layer 603 on first PMOS device region 211 is removed.

Figure 6B:
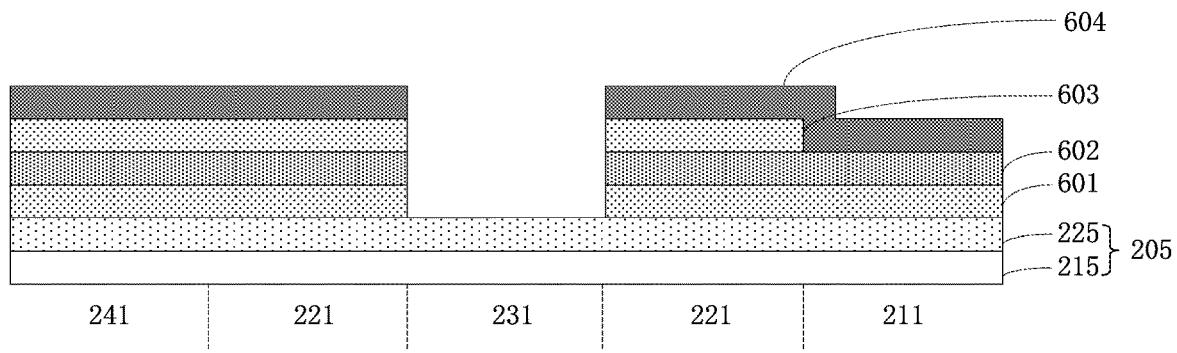

Referring to FIG. 6B, a third TiN layer 604 is deposited on second TiN layer 503 and exposed portion of TaN layer 602. Thereafter, a portion of third TiN layer 604, a portion of second TiN layer 603, a portion of TaN layer, and a portion of first TiN on first NMOS device region 231 are removed to expose a surface of gate dielectric layer 205.

Figure 6C:
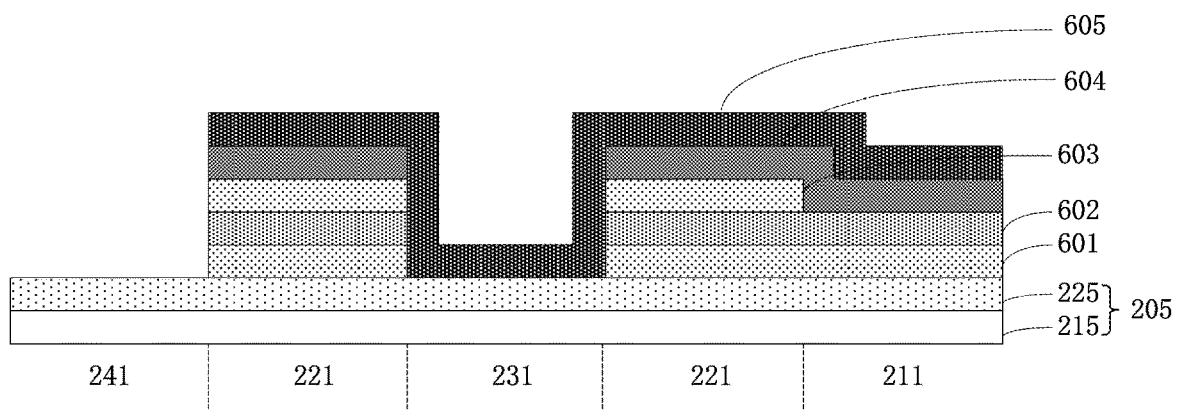

Referring to FIG. 6C, a fourth TiN layer 605 is deposited on third TiN layer 604 and exposed portion of gate dielectric layer 205. Thereafter, a portion of fourth TiN layer 605, a portion of fourth TiN layer, a portion of TaN layer, a portion of third TiN layer 504, a portion of second TiN layer, and a portion of first TiN layer on second NMOS device region 241 are removed.

Figure 6D:
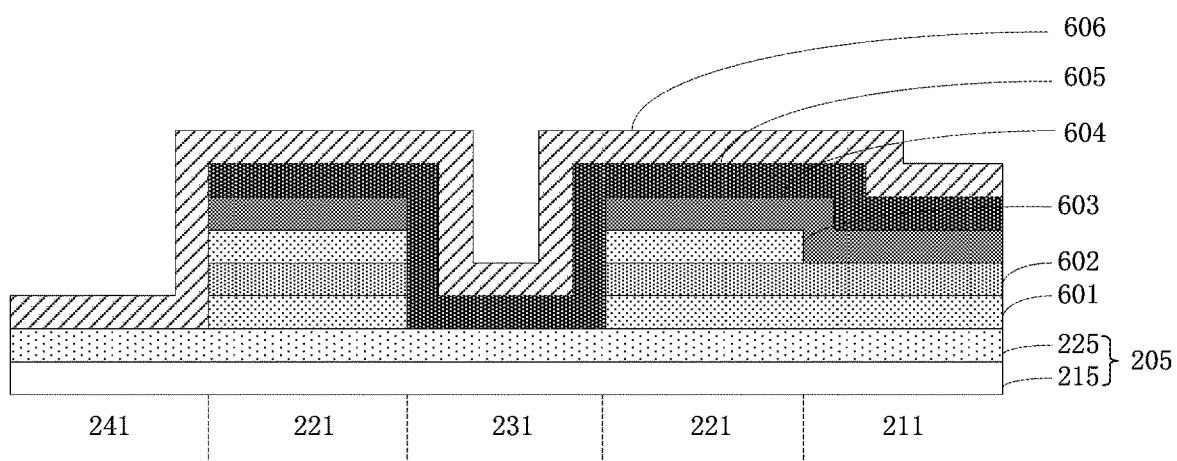

Referring to FIG. 6D, a fifth TiN layer 606 is deposited on fourth TiN layer 605 and on the exposed surface of gate dielectric layer 205 on second NMOS device region 241.

In this manner, different initial P-type work function adjustment material layers are formed over the different device regions. The corresponding P-type work function adjustment layers are then formed with reference to FIGS. 2A to 2F.

Figure 7A:
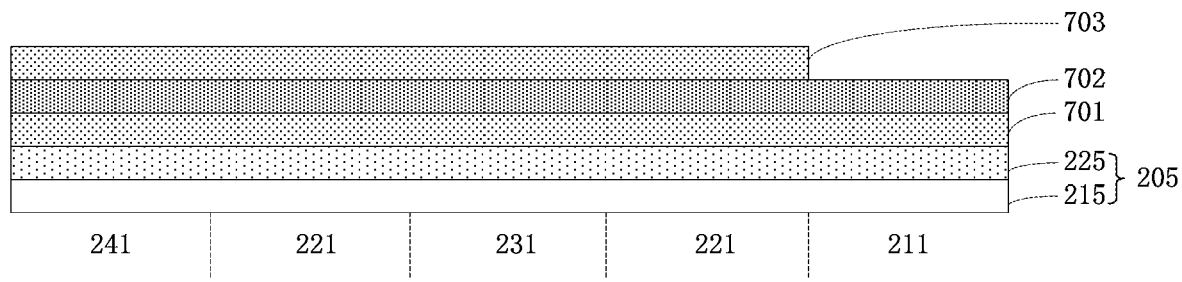
FIGS. 7A to 7C are cross-sectional views of intermediate stages of a method for forming an initial P-type work function adjustment material layer according to a fourth embodiment of the present disclosure.
Figure 7B:
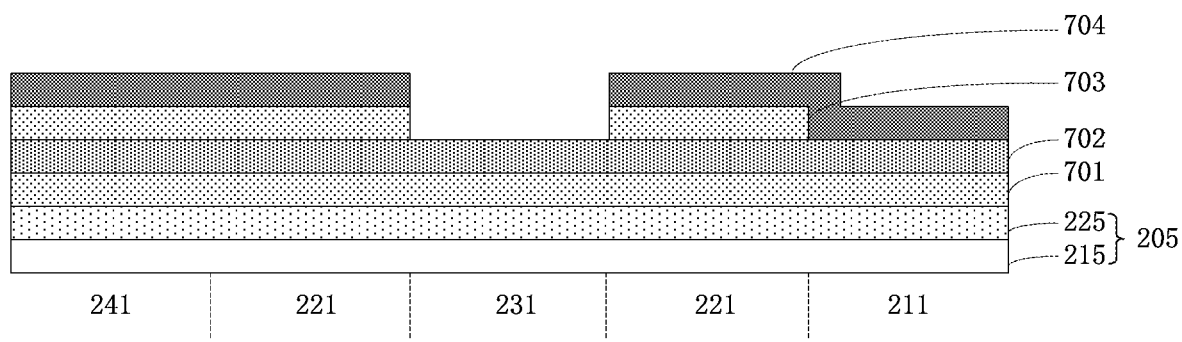
Figure 7C:
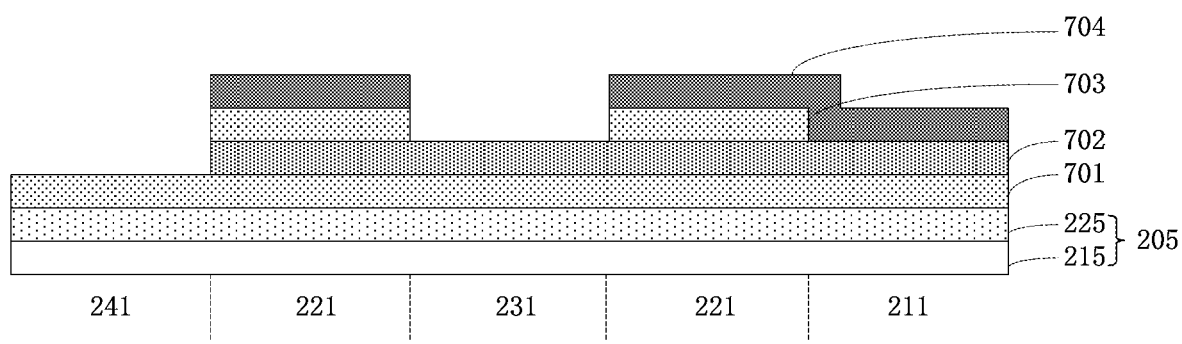

FIGS. 7A to 7C are cross-sectional views of intermediate stages of a method for forming an initial P-type work function adjustment material layer according to a fourth embodiment of the present disclosure.

Referring to FIG. 7A, a first TiN layer 701, a TaN layer 702, and a second TiN layer 703 are sequentially deposited on the substrate structure shown in FIG. 2A (i.e., on gate dielectric layer 205). Then, a portion of second TiN layer 703 on first PMOS device region 211 is removed to expose a surface of TaN layer 702.

Referring to FIG. 7B, a third TiN layer 704 is deposited on second TiN layer 703 and the exposed surface of TaN layer 702. Thereafter, a portion of third TiN layer 704 and a portion of second TiN layer 703 on first NMOS device region 231 are removed to expose a surface of TaN layer.

Referring to FIG. 7C, a portion of third TiN layer 704, a portion of second TiN layer 703, a portion of TaN layer 702 on second NMOS device region 241 are removed to expose a surface of first TiN layer 701.

In this manner, different initial P-type work function adjustment material layers are formed over the different device regions. The corresponding P-type work function adjustment layers are then formed with reference to FIGS. 2A to 2F.

FIGS. 8A to 8D are cross-sectional views of intermediate stages of a method for forming an initial P-type work function adjustment material layer according to a fifth embodiment of the present disclosure.

Figure 8A:
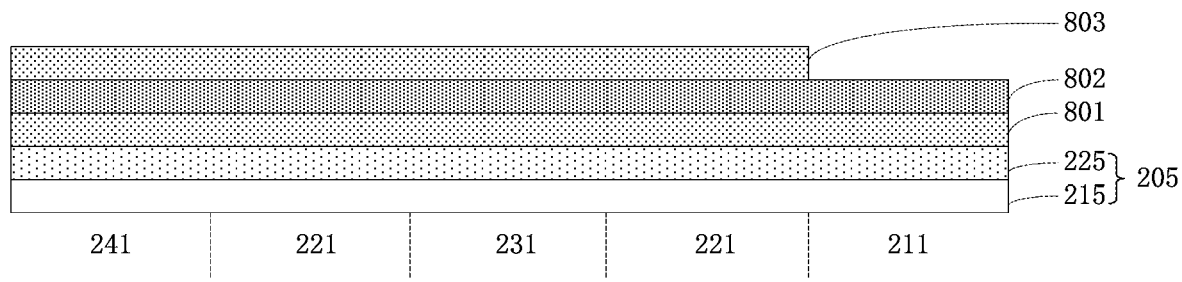
FIGS. 8A to 8D are cross-sectional views of intermediate stages of a method for forming an initial P-type work function adjustment material layer according to a fifth embodiment of the present disclosure.

Referring to FIG. 8A, a first TiN layer 801, a TaN layer 802, and a second TiN layer 803 are sequentially deposited on the substrate structure shown in FIG. 2A (i.e., on gate dielectric layer 205). Thereafter, a portion of second TiN layer 803 on first PMOS device region 211 is removed to expose a surface of TaN layer 802.

Figure 8B:
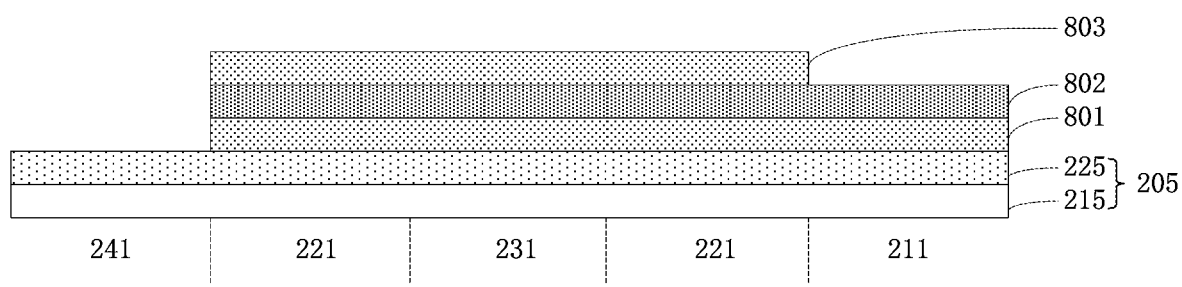

Referring to FIG. 8B, a portion of second TiN layer 803, a portion of TaN layer 802, and a portion of first TiN 801 on second NMOS device region 241 are removed to expose a surface of gate dielectric layer 205.

Figure 8C:
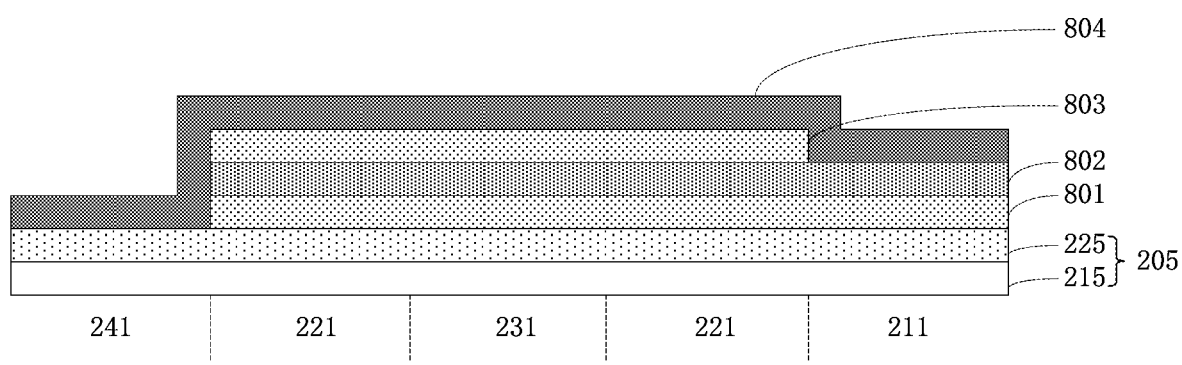

Referring to FIG. 8C, a third TiN layer 804 is deposited on second TiN layer 803, the exposed surface of TaN layer.

Figure 8D:
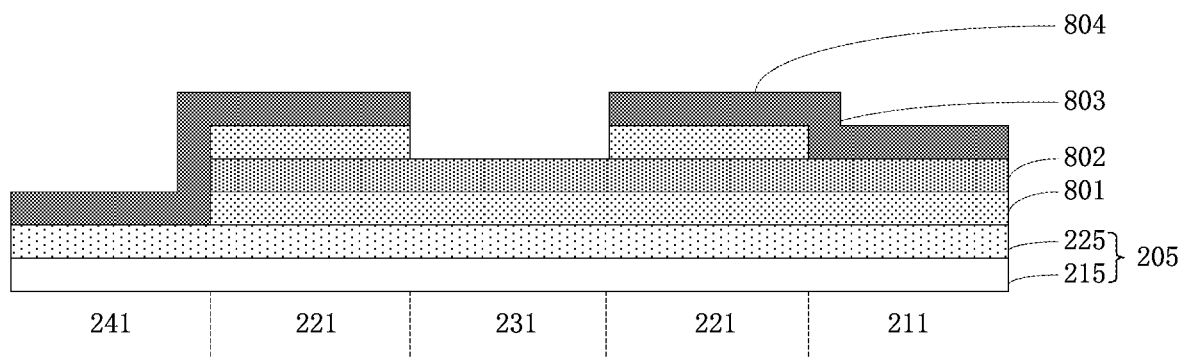

Referring to FIG. 8D, a portion of third TiN layer 804, and a portion of second TiN layer 803 on first NMOS device region 231 are removed to expose a surface of TaN layer 802.

In this manner, different initial P-type work function adjustment material layers are formed over the different device regions. The corresponding P-type work function adjustment layers are then formed with reference to FIGS. 2A to 2F. The P-type work function adjustment layers that are formed in the fifth embodiment are substantially the same as the P-type work function adjustment layers formed in the fourth embodiment, but their processes are different.

FIGS. 9A to 9D are cross-sectional views of intermediate stages of a method for forming an initial P-type work function adjustment material layer according to a sixth embodiment of the present disclosure.

Figure 9A:
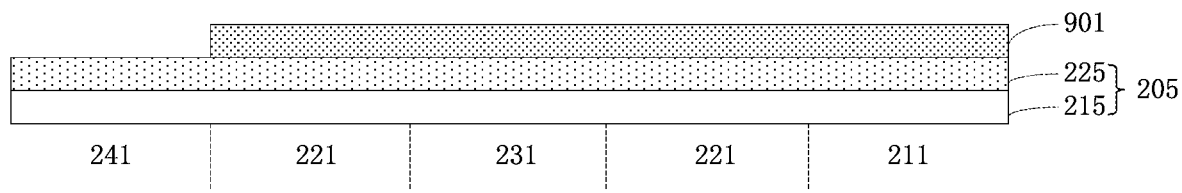
FIGS. 9A to 9D are cross-sectional views of intermediate stages of a method for forming an initial P-type work function adjustment material layer according to a sixth embodiment of the present disclosure.

Referring to FIG. 9A, a first TiN layer 901 is deposited on the substrate structure shown in FIG. 2A (i.e., on gate dielectric layer 205). Thereafter, a portion of first TiN layer 901 on second NMOS device region 241 is removed to expose a surface of gate dielectric layer 205.

Figure 9B:
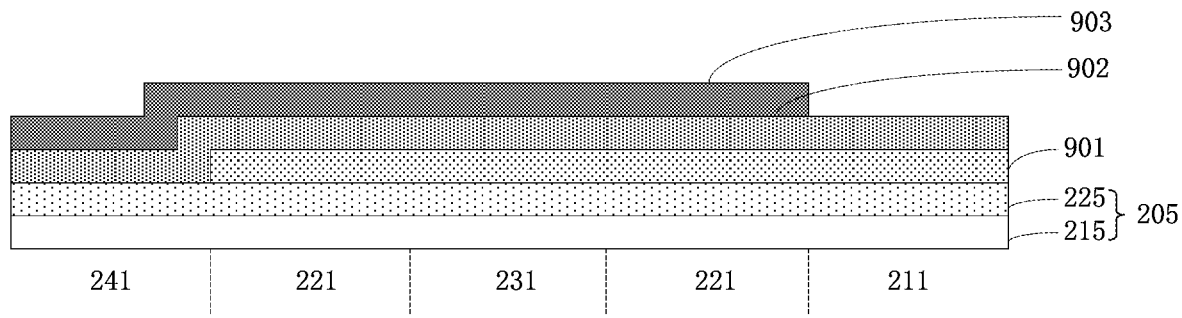

Referring to FIG. 9B, a TaN layer 903 and a second TiN layer 903 are sequentially deposited on first TiN layer 901 and on the exposed surface of gate dielectric layer 205. Thereafter, a portion of second TiN layer 903 on first PMOS device region 211 is removed to expose a surface of TaN layer 902.

Figure 9C:
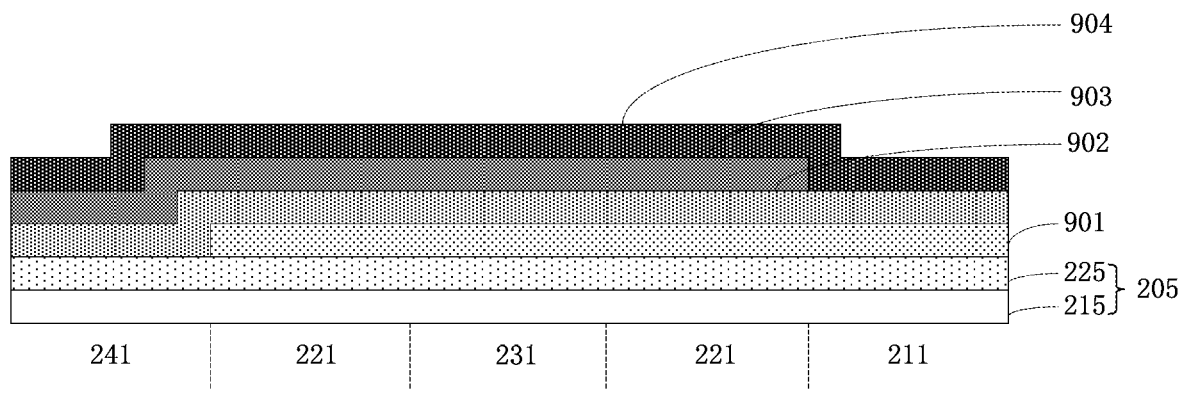

Referring to FIG. 9C, a third TiN layer 904 is deposited on second TiN layer 903 and on the exposed surface of TaN layer 902.

Figure 9D:
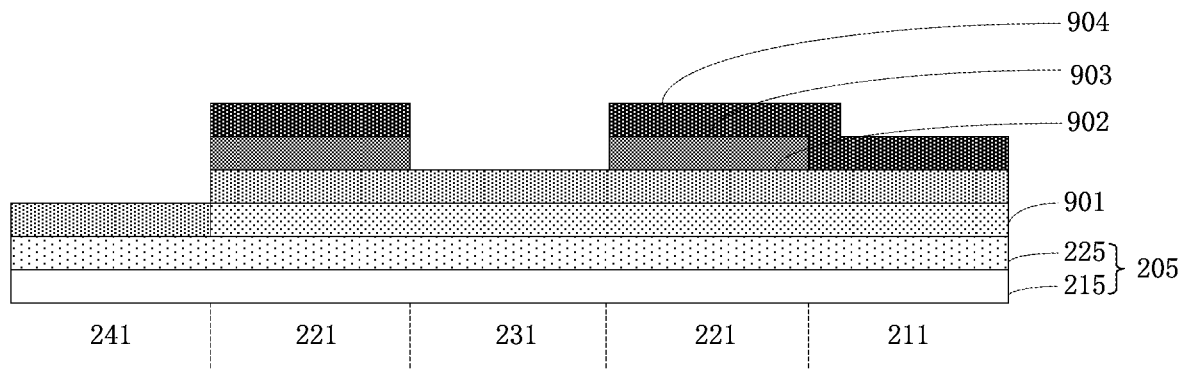

Referring to FIG. 9D, a portion of third TiN layer 904 and a portion of second TiN layer 903 on first NMOS device region 231 and on second NMOS device region 241 are removed to expose a surface of TaN layer 902.

In this manner, different initial P-type work function adjustment material layers are formed over the different device regions. The corresponding P-type work function adjustment layers are then formed with reference to FIGS. 2A to 2F.

Embodiments of the present disclosure also provide a semiconductor device. Referring to FIG. 3B, the semiconductor device includes a substrate 201, a semiconductor column 202 vertically protruding from substrate 201, a first contact material layer 203 on substrate 201 and in direct contact with a lower portion of semiconductor column 202, and a first insulating material layer 204 on first contact material layer 203 and having an upper surface that is lower than an upper surface of semiconductor column 202. In one embodiment, semiconductor column 202 is a nanowire.

The semiconductor device further includes a gate stack structure on first insulating material layer 204. The gate stack structure surrounds a portion of gate dielectric material layer 205 disposed on sidewalls of semiconductor column 202. The gate stack structure includes, sequentially from inside to outside) a P-type work function adjustment layer (e.g., first P-type work function adjustment layer 217, second P-type work function adjustment layer 227, third P-type work function adjustment layer 237, or fourth P-type work function adjustment layer 247), an N-type work function adjustment layer 208, and a gate 209.

In another embodiment, referring to FIG. 3C, the semiconductor device further includes a second insulating material layer 301 on the gate stack structure. Second insulating material layer 301 has an upper surface that is flush with the upper surface of the portion of gate dielectric material layer 205 disposed on the sidewalls of semiconductor column 202. The semiconductor device also includes a second contact material layer 302 on an upper portion of semiconductor column 202.

In some other embodiments, the semiconductor device further includes a first contact extending to first contact material layer 203, a second contact extending to gate 209, and a third contact extending to second contact material layer 302.

In one embodiment, referring still to FIG. 3C, substrate 201 may include a first PMOS device region 211 having one or more first NMOS devices, a second PMOS device region 221 having one or more second PMOS devices, a first NMOS device region 231 having one or more first NMOS devices, and a second NMOS device region 241 having one or more second NMOS devices. The first NMOS device has a threshold voltage that is lower than a threshold voltage of the second NMOS device. The first PMOS device has a threshold voltage that is lower than a threshold voltage of the second PMOS device.

Accordingly, in the embodiment, semiconductor column 202 includes a plurality of semiconductor pillars. In one exemplary embodiment, semiconductor column 202 includes a first semiconductor pillar 212 on first PMOS device region 211, a second semiconductor pillar 222 on second PMOS device region 221, a third semiconductor pillar 232 on first NMOS device region 231, and a fourth semiconductor pillar 242 on second NMOS device region 241. In the embodiment, the P-type work function adjustment layers in the gate stack structure that surrounds first semiconductor pillar 212, second semiconductor pillar 222, third semiconductor pillar 232, and fourth semiconductor pillar 242 are first P-type work function adjustment layer 217, second P-type work function adjustment layer 227, third P-type work function adjustment layer 237, and fourth P-type work function adjustment layer 247, respectively. First P-type work function adjustment layer 217, second P-type work function adjustment layer 227, third P-type work function adjustment layer 237, and fourth P-type work function adjustment layer 247 are different from each other.

First P-type work function adjustment layer 217, second P-type work function adjustment layer 227, third P-type work function adjustment layer 237, and fourth P-type work function adjustment layer 247 may be implemented in different embodiments.

In the first embodiment, referring to FIG. 4D, first P-type work function adjustment layer 217 includes, sequentially from inside to outside, second TiN layer 402, third TiN layer 403, and fourth TiN layer 404. Second P-type work function adjustment layer 227 includes, sequentially from inside to outside, first TiN layer 401, second TiN layer 402, third TiN layer 403, and fourth TiN layer 404. Third P-type work function adjustment layer 237 includes, sequentially from inside to outside, third TiN layer 403 and fourth TiN layer 404. Fourth P-type work function adjustment layer 247 includes fourth TiN layer 404.

In the second embodiment, referring to FIG. 5C, first P-type work function adjustment layer 217 includes, sequentially from inside to outside, first TiN layer 501, TaN layer 502, third TiN layer 504, and fourth TiN layer 505. Second P-type work function adjustment layer 227 includes, sequentially from inside to outside, first TiN layer 501, TaN layer 502, second TiN layer 503, third TiN layer 504, and fourth TiN layer 505. Third P-type work function adjustment layer 237 includes, sequentially from inside to outside, first TiN layer 501, TaN layer 502, and fourth TiN layer 505. Fourth P-type work function adjustment layer 247 includes, sequentially from inside to outside, first TiN layer 501 and TaN layer 502.

In the third embodiment, referring to FIG. 6D, first P-type work function adjustment layer 217 includes, sequentially from inside to outside, first TiN layer 601, TaN layer 602, third TiN layer 604, fourth TiN layer 605, and fifth TiN layer 606. Second P-type work function adjustment layer 227 includes, sequentially from inside to outside, first TiN layer 601, TaN layer 602, second TiN layer 603, third TiN layer 604, fourth TiN layer 605, and fifth TiN layer 606. Third P-type work function adjustment layer 237 includes, sequentially from inside to outside, fourth TiN layer 605 and fifth TiN layer 606. Fourth P-type work function adjustment layer 247 includes fifth TiN layer 606.

In the fourth embodiment, referring to FIG. 7C, first P-type work function adjustment layer 217 includes, sequentially from inside to outside, first TiN layer 701, TaN layer 602, and second TiN layer 702. Second P-type work function adjustment layer 227 includes, sequentially from inside to outside, first TiN layer 701, TaN layer 702, second TiN layer 703, and third TiN layer 704. Third P-type work function adjustment layer 237 includes, sequentially from inside to outside, first TiN layer 701 and TaN layer 702. Fourth P-type work function adjustment layer 247 includes first TiN layer 701.

In the fifth embodiment, referring to FIG. 8D, first P-type work function adjustment layer 217 includes, sequentially from inside to outside, first TiN layer 801, TaN layer 802, and third TiN layer 804. Second P-type work function adjustment layer 227 includes, sequentially from inside to outside, first TiN layer 801, TaN layer 802, second TiN layer 803, and third TiN layer 804. Third P-type work function adjustment layer 237 includes, sequentially from inside to outside, first TiN layer 801 and TaN layer 802. Fourth P-type work function adjustment layer 247 includes third TiN layer 804.

In the sixth embodiment, referring to FIG. 9D, first P-type work function adjustment layer 217 includes, sequentially from inside to outside, first TiN layer 901, TaN layer 902, and third TiN layer 904. Second P-type work function adjustment layer 227 includes, sequentially from inside to outside, first TiN layer 901, TaN layer 902, second TiN layer 903, and third TiN layer 904. Third P-type work function adjustment layer 237 includes, sequentially from inside to outside, first TiN layer 901 and TaN layer 902. Fourth P-type work function adjustment layer 247 includes TaN layer 902.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A semiconductor device, comprising:
   a substrate;
   a semiconductor column vertically disposed on the substrate;
   a first contact material layer on the substrate and in contact with a lower portion of the semiconductor column;
   a first insulating material layer on the first contact material layer and having an upper surface lower than an upper surface of the semiconductor column;
   a gate dielectric material layer on the first insulating material layer and on a portion of sidewalls of the semiconductor column while exposing an upper portion of the semiconductor column;
   a gate stack structure on the gate dielectric material layer and surrounding a portion of the gate dielectric material layer on the sidewalls of the semiconductor column, the gate stack structure comprising, sequentially from inside to outside, a P-type work function layer, an N-type work function layer, and a gate;
   the substrate comprises a first PMOS device region having a first PMOS device, a second PMOS device region having a second PMOS device, a first NMOS device region having a first NMOS device, and a second NMOS device region having a second NMOS device;
   the semiconductor column comprises a first semiconductor pillar on the first PMOS device region, a second semiconductor pillar on the second PMOS device region, a third semiconductor pillar on the first NMOS device region, and a fourth semiconductor pillar on the second PMOS device region;
   the P-type work function layer of the gate stack structure comprises a first P-type work function layer surrounding the first semiconductor pillar, a second P-type work function layer surrounding the second semiconductor pillar, a third P-type work function layer surrounding the third semiconductor pillar, and a fourth P-type work function layer surrounding the fourth semiconductor pillar;
   the first PMOS device has a threshold voltage greater than a threshold voltage of the second PMOS device;
   the first NMOS device has a threshold voltage greater than a threshold voltage of the second NMOS device; and
   the first, second, third, and fourth P-type work function layers are different from each other.

2. The semiconductor device of claim 1, wherein:
   the first P-type work function layer comprises, sequentially from inside to outside, a second TiN layer, a third TiN layer, and a fourth TiN layer;

the second P-type work function layer comprises, sequentially from inside to outside, a first TiN layer, the second TiN layer, the third TiN layer, and the fourth TiN layer;

the third P-type work function layer comprises, sequentially from inside to outside, the third TiN layer, and the fourth TiN layer; and the fourth P-type work function layer comprises the third TiN layer.

3. The semiconductor device of claim 1, wherein:

the first P-type work function layer comprises, sequentially from inside to outside, a first TiN layer, a TaN layer, a third TiN layer, and a fourth TiN layer;

the second P-type work function layer comprises, sequentially from inside to outside, the first TiN layer, the TaN layer, a second TiN layer, the third TiN layer, and the fourth TiN layer;

the third P-type work function layer comprises, sequentially from inside to outside, the first TiN layer, the TaN layer, and the fourth TiN layer; and the fourth P-type work function layer comprises the first TiN layer and the TaN layer.

4. The semiconductor device of claim 1, wherein:

the first P-type work function layer comprises, sequentially from inside to outside, a first TiN layer, a TaN layer, a third TiN layer, a fourth TiN layer, and a fifth TiN layer;

the second P-type work function layer comprises, sequentially from inside to outside, the first TiN layer, the TaN layer, the third TiN layer, and the fourth TiN layer;

the third P-type work function layer comprises, sequentially from inside to outside, the fourth TiN layer and the fifth TiN layer; and the fourth P-type work function layer comprises the fifth TiN layer.

5. The semiconductor device of claim 1, wherein:

the first P-type work function layer comprises, sequentially from inside to outside, a first TiN layer, a TaN layer, and a third TiN layer;

the second P-type work function layer comprises, sequentially from inside to outside, the first TiN layer, the TaN layer, a second TiN layer, and the third TiN layer;

the third P-type work function layer includes, sequentially from inside to outside, the first TiN layer and the TaN layer; and the fourth P-type work function layer comprises the third TiN layer.

6. The semiconductor device of claim 1, wherein:

the first P-type work function layer comprises, sequentially from inside to outside, a first TiN layer, a TaN layer, and a third TiN layer;

the second P-type work function layer comprises, sequentially from inside to outside, the first TiN layer, the TaN layer, a second TiN layer, and the third TiN layer;

the third P-type work function layer comprises, sequentially from inside to outside, the first TiN layer and the TaN layer; and the fourth P-type work function layer comprises the TaN layer.

7. The semiconductor device of claim 1, further comprising:

a second insulating layer on the gate stack structure having an upper surface flush with an upper surface of the gate dielectric material layer; and a second contact material layer in contact with the upper portion of the semiconductor column.

8. The semiconductor device of claim 7, further comprising:

a first contact extending to the first contact material layer;

a second contact extending to the gate; and a third contact in contact with the second contact material layer.

9. The semiconductor device of claim 1, wherein the semiconductor column is a nanowire.

10. A method for manufacturing a semiconductor device, comprising:

providing a substrate structure including a substrate, a semiconductor column vertically disposed on the substrate, a first contact material layer on the substrate and in contact with a lower portion of the semiconductor column, a first insulating material layer on the first contact material layer and having an upper surface lower than an upper surface of the semiconductor column, and a gate dielectric material layer on the first insulating material layer and on sidewalls and an upper surface of the semiconductor column; and forming a gate stack structure on the gate dielectric material layer surrounding a portion of the gate dielectric material layer on the sidewalls of the semiconductor column, the gate stack structure comprising, sequentially from inside to outside, a P-type work function layer, an N-type work function layer, and a gate, wherein:

the substrate comprises a first PMOS device region having a first PMOS device, a second PMOS device region having a second PMOS device, a first NMOS device region having a first NMOS device, and a second NMOS device region having a second NMOS device;

the semiconductor column comprises a first semiconductor pillar on the first PMOS device region, a second semiconductor pillar on the second PMOS device region, a third semiconductor pillar on the first NMOS device region, and a fourth semiconductor pillar on the second PMOS device region;

the P-type work function layer of the gate stack structure comprises a first P-type work function layer surrounding the first semiconductor pillar, a second P-type work function layer surrounding the second semiconductor pillar, a third P-type work function layer surrounding the third semiconductor pillar, and a fourth P-type work function layer surrounding the fourth semiconductor pillar;

the first PMOS device has a threshold voltage greater than a threshold voltage of the second PMOS device;

the first NMOS device has a threshold voltage greater than a threshold voltage of the second NMOS device; and the first, second, third, and fourth P-type work function layers are different from each other.

11. The method of claim 10, wherein forming the gate stack structure comprises:

forming a P-type work function adjustment material layer on a portion of the gate dielectric material layer disposed on sidewalls of a corresponding semiconductor pillar on one of the device regions;

forming an N-type work function adjustment material layer on the P-type work function adjustment material layer;

forming a gate material layer on the gate dielectric material layer and on the N-type work function adjustment material layer;

planarizing the gate material layer such that an upper surface of the gate material layer is flush with an upper surface of the gate dielectric material layer on the semiconductor column;

etching the gate material layer, the P-type work function adjustment material layer, and the N-type work function adjustment material layer to expose a portion of the gate dielectric material layer on the upper surface and the sidewalls of the semiconductor column.

12. The method of claim 11, wherein forming the P-type work function adjustment material layer on the portion of the gate dielectric material layer disposed on sidewalls of the corresponding semiconductor pillar on one of the device regions comprises:

forming an initial P-type work function adjustment material layer corresponding to one of the devices on the substrate structure;

etching the initial P-type work function adjustment material layer using an anisotropic etching process to form a corresponding P-type work function adjustment material layer.

13. The method of claim 12, wherein forming the initial P-type work function adjustment material layer comprises:
depositing a first TiN layer on the substrate structure;
removing a portion of the first TiN layer on the first PMOS device region;
depositing a second TiN layer;
removing a portion of the second TiN layer and a portion of the first TiN layer on the first NMOS device region;
depositing a third TiN layer;
removing a portion of the third TiN layer, a portion of the second TiN layer, and a portion of the first TiN layer on the second NMOS device region;
depositing a fourth TiN layer.

14. The method of claim 12, wherein forming the initial P-type work function adjustment material layer comprises:
sequentially depositing a first TiN layer, a TaN layer, and a second TiN layer on the substrate structure;
removing a portion of the second TiN layer on the first PMOS device region;
depositing a third TiN layer;
removing a portion of the second TiN layer and a portion of the third TiN layer on the first NMOS device region;
depositing a fourth TiN layer;
removing a portion of the second TiN layer, a portion of the third TiN layer, and a portion of the fourth TiN layer on the second NMOS device region.

15. The method of claim 12, wherein forming the initial P-type work function adjustment material layer comprises:
sequentially depositing a first TiN layer, a TaN layer, and a second TiN layer on the substrate structure;
removing a portion of the second TiN layer on the first PMOS device region;
depositing a third TiN layer;
removing a portion of the first TiN layer, a portion of the TaN layer, a portion of the second TiN layer, and a portion of the third TiN layer on the first NMOS device region;
depositing a fourth TiN layer;
removing a portion of the first TiN layer, a portion of the TaN layer, a portion of the second TiN layer, a portion of the third TiN layer, and a portion of the fourth TiN layer on the second NMOS device region; and
depositing a fifth TiN layer.

16. The method of claim 12, wherein forming the initial P-type work function adjustment material layer comprises:
sequentially depositing a first TiN layer, a TaN layer, and a second TiN layer on the substrate structure;
removing a portion of the second TiN layer on the first PMOS device region;
depositing a third TiN layer;
removing a portion of the second TiN layer and a portion of the third TiN layer on the first NMOS device region; and
removing a portion of the TaN layer, a portion of the second TiN layer, and a portion of the third TiN layer on the second NMOS device region.

17. The method of claim 12, wherein forming the initial P-type work function adjustment material layer comprises:
sequentially depositing a first TiN layer, a TaN layer, and a second TiN layer on the substrate structure;
removing a portion of the second TiN layer on the first PMOS device region;
removing a portion of the first TiN layer, a portion of TaN layer, and a portion of the second TiN layer on the second NMOS device region;
depositing a third TiN layer; and
removing a portion of the second TiN layer and a portion of the third TiN layer on the first NMOS device region.

18. The method of claim 12, wherein forming the initial P-type work function adjustment material layer comprises:
depositing a first TiN layer on the substrate structure;
removing a portion of the first TiN layer on the second NMOS device region;
sequentially depositing a TaN layer and a second TiN layer;
removing a portion of the second TiN layer on the first PMOS device region;
depositing a third TiN layer;
removing a portion of the second TiN layer and a portion of the third TiN layer on the first and second NMOS device regions.

* * * * *